(12) United States Patent
Lin et al.

(10) Patent No.: US 7,768,233 B2
(45) Date of Patent: Aug. 3, 2010

(54) DYNAMICALLY ADAPTIVE METHOD FOR DETERMINING THE STATE OF CHARGE OF A BATTERY

(75) Inventors: Jian Lin, Beverly Hills, MI (US); Xidong Tang, Sterling Heights, MI (US); Brian J. Koch, Berkley, MI (US); Damon R. Frisch, Troy, MI (US); Michael J. Gielniak, Romeo, MI (US)

(73) Assignee: GM Global Technology Operations, Inc., Detroit, MI (US)

( * ) Notice: Subject to any disclaimer, the term of this patent is extended or adjusted under 35 U.S.C. 154(b) by 396 days.

(21) Appl. No.: 11/867,497

(22) Filed: Oct. 4, 2007

(65) Prior Publication Data

US 2009/0091299 A1    Apr. 9, 2009

(51) Int. Cl.
*H02J 7/00* (2006.01)
(52) U.S. Cl. .................. 320/132; 324/426; 324/431
(58) Field of Classification Search .................. 320/132
See application file for complete search history.

(56) References Cited

U.S. PATENT DOCUMENTS

| | | | |
|---|---|---|---|
| 5,321,627 A | 6/1994 | Reher | |
| 6,285,163 B1 * | 9/2001 | Watanabe et al. | 320/132 |
| 6,359,419 B1 | 3/2002 | Verbrugge et al. | |
| 6,531,874 B2 | 3/2003 | Mentgen et al. | |
| 6,639,385 B2 | 10/2003 | Verbrugge et al. | |
| 7,109,685 B2 * | 9/2006 | Tate et al. | 320/132 |
| 7,308,958 B2 * | 12/2007 | Tamor et al. | 180/65.1 |
| 7,324,902 B2 * | 1/2008 | Verbrugge et al. | 702/64 |
| 7,564,221 B2 * | 7/2009 | Asai et al. | 320/132 |
| 2002/0193953 A1 | 12/2002 | Hoenig et al. | |
| 2004/0162683 A1 | 8/2004 | Verbrugge et al. | |

OTHER PUBLICATIONS

Verbrugge, M., et al., "Adaptive Energy Management of Electric and Hybrid Electric Vehicles," Journal of the Electrochemical Society, 2005, pp. A333-A342, vol. 152, No. 2.
Verbrugge, M., et al., "Adaptive State of Charge Algorithm for Nickel Metal Hydride Batteries Including Hysteresis Phenomena," Journal of Power Sources, 2004, pp. 236-249, vol. 126.

* cited by examiner

*Primary Examiner*—Edward Tso
*Assistant Examiner*—Ramy Ramadan
(74) *Attorney, Agent, or Firm*—Ingrassia Fisher & Lorenz, P.C.

(57) ABSTRACT

A method for determining the state of charge (SOC) of a lithium ion battery is provided. The method leverages a circuit model of the lithium ion battery, and generates four battery parameters from which the SOC is derived.

12 Claims, 3 Drawing Sheets

US 7,768,233 B2

DYNAMICALLY ADAPTIVE METHOD FOR DETERMINING THE STATE OF CHARGE OF A BATTERY

TECHNICAL FIELD

The subject matter described herein generally relates to batteries used for electric or hybrid electric drivetrains, and more particularly relates to a method for recursively determining a state of charge in a battery system.

BACKGROUND

In today's automotive market, there exist a variety of propulsion or drive technologies used to power vehicles. The technologies include internal combustion engines (ICEs), electric drive systems utilizing batteries and/or fuel cells as an energy or power source, hybrid systems utilizing a combination of internal combustion engines and electric drive systems, and pure electric systems. The propulsion systems each have specific technological, financial, and performance advantages and disadvantages, depending on the state of energy prices, energy infrastructure developments, environmental laws, and government incentives.

The increasing demand to improve fuel economy and reduce emissions in present vehicles has led to the development of advanced hybrid vehicles, as well as pure electric vehicles. With regard to pure electrical vehicles, no ICE is required. Electric vehicles are classified as vehicles having only one energy source, typically a battery or a hydrogen-fed fuel cell. Hybrid vehicles are classified as vehicles having at least two separate energy sources, typically gasoline to feed an internal combustion engine and a battery system linked to an electric traction motor. Hybrid vehicles, as compared to standard vehicles driven by an ICE, have improved fuel economy and reduced emissions. During varying driving conditions, hybrid vehicles will alternate between separate power sources, depending on the most efficient manner of operation of each power source. For example, during most operating conditions, a hybrid vehicle equipped with an ICE and an electric motor will shut down the ICE during a stopped or idle condition, allowing the electric motor to propel the vehicle and eventually restart the ICE, improving fuel economy for the hybrid vehicle.

Hybrid vehicles are broadly classified into series or parallel drivetrains, depending upon the configuration of the drivetrains. In a series drivetrain utilizing an ICE and an electric traction motor, only the electric motor drives the wheels of a vehicle. The ICE converts a fuel source to mechanical energy to turn a generator, which converts the mechanical energy to electrical energy to drive the electric motor. In a parallel hybrid drivetrain system, two power sources such as an ICE and an electric traction motor operate in parallel to propel a vehicle. Generally, a hybrid vehicle having a parallel drivetrain combines the power and range advantages of a conventional ICE with the efficiency and electrical regeneration capability of an electric motor to increase fuel economy and lower emissions, as compared with a traditional ICE vehicle. In addition, hybrid vehicles can incorporate both series and parallel paths. Further, hybrids are often described as being either charge-depleting or charge-sustaining with reference to a battery pack. Charge-depleting hybrids can be charged off the electrical grid; thus, these hybrids share many of the characteristics of purely electric vehicles. In contrast, the batteries in charge-sustaining hybrids receive all of their electrical charging from the ICE and/or from regenerative braking.

Battery packs having secondary/rechargeable batteries are an important component of hybrid vehicle systems, as they enable an electric motor/generator (MoGen) to store braking energy in the battery pack during regeneration and charging by the ICE. The MoGen utilizes the stored energy in the battery pack to propel or drive the vehicle when the ICE is not operating. During operation, the ICE will be turned on and off intermittently, according to driving conditions, causing the battery pack to be alternatively charged and discharged by the MoGen.

State of charge (SOC) is a term that refers to the stored charge available to do work relative to that which is available after the battery has been fully charged. SOC can be viewed as a thermodynamic quantity, enabling one to assess the potential energy of the system. As can be appreciated, the state of charge (SOC) of the battery pack in a vehicle system such as a hybrid vehicle system is important in relation to vehicle efficiency, emissions, and power availability. For example, a vehicle operator or an onboard controller might utilize the SOC for purposes of regulating the operation of the battery pack.

It is known in the art to use a look up table to regulate a battery pack having parameters pre-computed based on a standard vehicle or an experimental vehicle. A standard vehicle is a reference vehicle other than the actual vehicle that is being operated. A difficulty with the prior art approaches is that they are either not vehicle specific, or lack a generalized approach to multiple parameter handling, thereby reducing the utility of the prior art systems. In addition, it is known in the art to use Coulomb counting to get an SOC value of a battery system. Coulomb counting is easily implemented, provided the initial SOC and the current efficiency is known precisely for all times and conditions. Because this is not normally the case, Coulomb counting tends to be an impractical solution.

BRIEF SUMMARY

A method is provided for determining SOC of a battery. An embodiment of the method begins by obtaining sampled terminal voltage data for a lithium ion battery, the lithium ion battery being characterized by its ohmic resistance (R), its open circuit voltage ($V_{oc}$), a time constant ($\tau = C_{dl} R_{ct}$) of the double layer effect, where $C_{dl}$ is the double layer capacitance of the lithium ion battery and $R_{ct}$ is charge transfer resistance, and by obtaining sampled terminal current data for the lithium ion battery. The method continues by calculating a present $V_{oc}$ value from the sampled terminal voltage data and the sampled terminal current data. The method then generates a present SOC value from the present $V_{oc}$ value.

A method is provided for determining SOC of a battery having an ohmic resistance (R), an open circuit voltage ($V_{oc}$), and a double layer voltage ($V_{dl}$) characterized by time constant ($\tau = C_{dl} R_{ct}$), where $C_{dl}$ is the double layer capacitance of the battery and $R_{ct}$ is charge transfer resistance. An embodiment of the method involves: obtaining sampled terminal voltage (V) data for the battery; obtaining sampled terminal current (I) data for the battery; and calculating a vector quantity $\bar{\phi}(k)$ in accordance with the relationship $\bar{\phi}(k) = [dt(k)V(k-1), I(k) - I(k-1)dt(k)I(k-1), dt(k)U(k-1)]^T$, where k indicates a present time step and U( ) indicates a unit step function. The method also calculates battery parameters $\theta_1, \theta_2, \theta_3,$ and $\theta_4$ in accordance with the relationship $V(k) - V(k-1) = \theta^T \bar{\phi}(k)$, where $\theta = [\theta_1, \theta_2, \theta_3, \theta_4]^T$. The method then generates a present SOC value from the battery parameters $\theta_1, \theta_2, \theta_3,$ and $\theta_4$. In these expressions, $$\theta_1 = -B = -\frac{1}{\tau},$$

where $\tau$ is a double layer time constant for the battery, $\theta_2=R$, $\theta_3=BR+A$, and $\theta_4=BV_{oc}$.

A diagnostic and control system for a vehicle battery is also provided. An embodiment of the diagnostic and control system includes a lithium ion battery pack, a power inverter module coupled to the lithium ion battery pack, and a controller coupled to the power inverter module and to the lithium ion battery pack. The lithium ion battery pack has an ohmic resistance (R), an open circuit voltage ($V_{oc}$), and a double layer voltage ($V_{dl}$) characterized by a time constant ($\tau=C_{dl}R_{ct}$), where $C_{dl}$ is a double layer capacitance of the lithium ion battery pack and $R_{ct}$ is charge transfer resistance. The controller is configured to regulate operation of the power inverter module, and the controller utilizes a computer-readable medium having stored thereon computer-executable instructions for determining SOC of the lithium ion battery pack. The computer-executable instructions are suitably written and designed to: obtain sampled terminal voltage data for the lithium ion battery pack; obtain sampled terminal current data for the lithium ion battery pack; calculate a present $V_{oc}$ value from the sampled terminal voltage data and the sampled terminal current data, the present $V_{oc}$ value being dependent upon $V_{dl}$ values of the lithium ion battery pack; and generate a present SOC value from the present $V_{oc}$ value.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

DESCRIPTION OF THE DRAWINGS

At least one embodiment of the present invention will hereinafter be described in conjunction with the following drawing figures, wherein like numerals denote like elements.

DESCRIPTION OF AN EXEMPLARY EMBODIMENT

Figure 1:
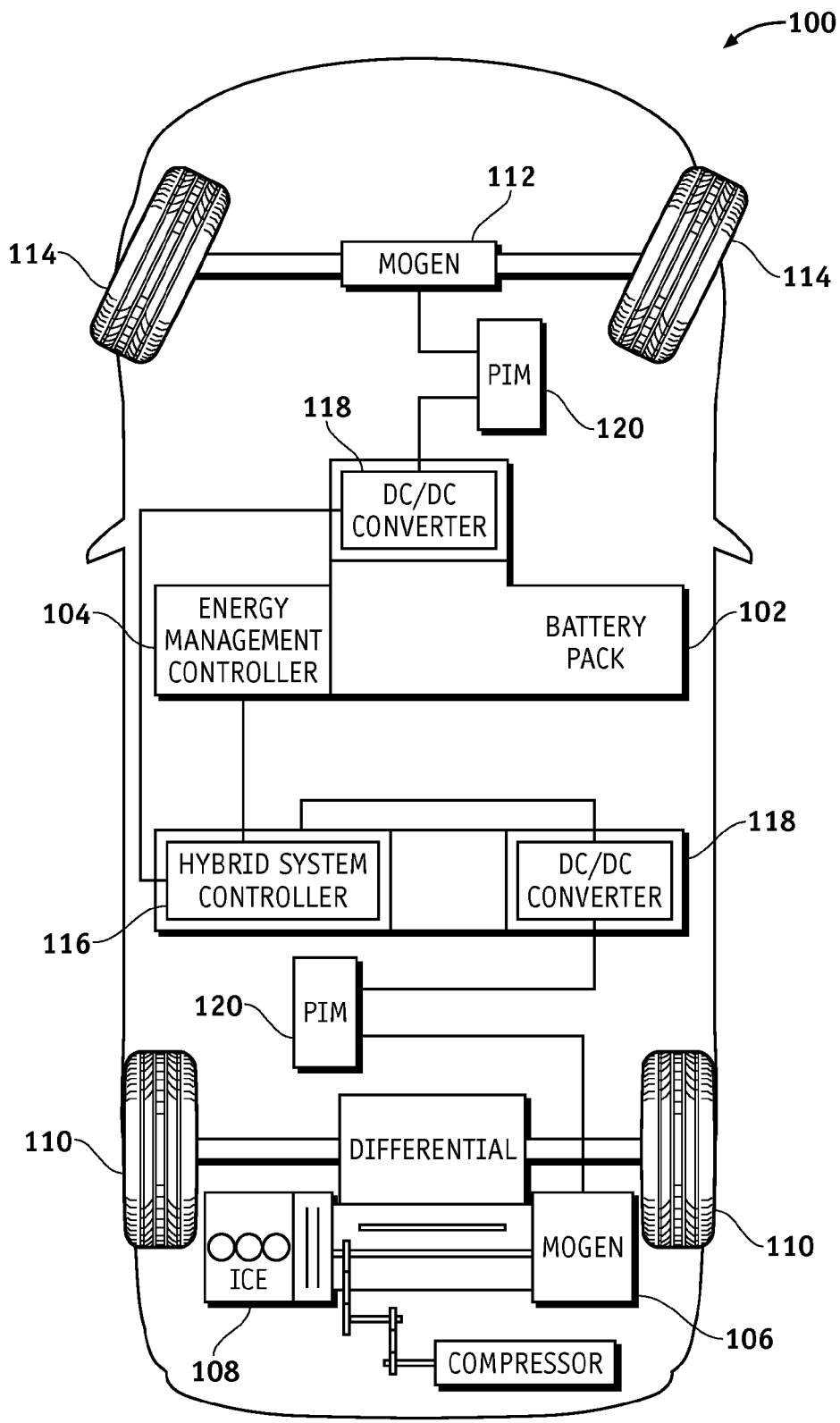
FIG. 1 is a schematic representation of an embodiment of a hybrid vehicle.

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Techniques and technologies may be described herein in terms of functional and/or logical block components and various processing steps. It should be appreciated that such block components may be realized by any number of hardware, software, and/or firmware components configured to perform the specified functions. For example, an embodiment of a system or a component may employ various integrated circuit components, e.g., memory elements, digital signal processing elements, logic elements, look-up tables, or the like, which may carry out a variety of functions under the control of one or more microprocessors or other control devices. In addition, those skilled in the art will appreciate that embodiments may be practiced in conjunction with any number of data transmission protocols and that the system described herein is merely one suitable example.

For the sake of brevity, conventional techniques related to hybrid and electric vehicle operation, battery operation, battery diagnostics, vehicle computing modules, and other functional aspects of the systems (and the individual operating components of the systems) may not be described in detail herein. Furthermore, the connecting lines shown in the various figures contained herein are intended to represent example functional relationships and/or physical couplings between the various elements. It should be noted that many alternative or additional functional relationships or physical connections may be present in an embodiment of the subject matter.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common mode).

The following description refers to elements or nodes or features being "connected" or "coupled" together. As used herein, unless expressly stated otherwise, "connected" means that one element/node/feature is directly joined to (or directly communicates with) another element/node/feature, and not necessarily mechanically. Likewise, unless expressly stated otherwise, "coupled" means that one element/node/feature is directly or indirectly joined to (or directly or indirectly communicates with) another element/node/feature, and not necessarily mechanically.

Accurate knowledge of internal battery parameters is important for purposes of controlling the battery systems of hybrid electric (and purely electric) vehicles. The methodology described herein adaptively extracts four internal parameters for lithium ion batteries. The advantages of the proposed methodology over existing techniques are better adaptation to variations in the environment, battery state, and driving conditions, higher computational efficiency, and lower implementation cost.

Lithium ion batteries are promising in the application to hybrid electric vehicles. To better control the propulsion battery systems in hybrid vehicles for long battery life and good fuel economy, onboard systems determine and process battery parameters such as the open-circuit voltage ($V_{oc}$), the ohmic resistance, the battery capacitance, etc. For example, the $V_{oc}$ is used to estimate the battery state of charge (SOC), which is an index associated with battery condition. However, the $V_{oc}$ and other battery internal parameters are not directly measurable during vehicle operation. Therefore, an efficient and effective technique that extracts the battery parameters from measured signals such as battery terminal voltage and current is very much needed. Moreover, the extraction methodology should be adaptive in nature to contemplate the varying environment, battery state, and different driving conditions.

The embodiment described herein can extract four internal parameters for lithium ion batteries (in contrast to existing systems that can only extract two internal parameters). Moreover, the embodiment described herein achieves good adaptation to variations and improved model efficiency through the difference equation approach. By eliminating predetermined, pre-calibrated lookup tables, all future battery operating characteristics (such as aging effects not contemplated by lookup tables) are fully and adaptively regressed in real time. Since the calibrations become dynamically predicted, the risk of battery-to-battery manufacturing variation (at point of sale) and battery-to-battery changes with variable vehicle usage from point of sale to the end of vehicle life are eliminated. This reduces calibration risk and optimizes battery usage efficiency for the entire life of the vehicle. This also eliminates the need for programming (at a service facility) new calibrations as vehicle mileage is accumulated. Furthermore, the technique described herein is computationally efficient, which reduces implementation cost because it can be realized using relatively inexpensive processing devices.

FIG. 1 is a schematic representation of an embodiment of a hybrid vehicle 100, which may incorporate the battery state of charge (SOC) determination technique described herein. The hybrid vehicle 100 includes a battery pack 102 having a single battery module or a plurality of individual battery modules. For this embodiment, the battery pack 102 comprises a plurality of lithium ion batteries connected in series to produce a 336 volt nominal bus, although any practical voltage can be accommodated. Certain aspects of the SOC determination techniques described herein may also be applicable to other battery types, e.g., nickel metal hydride (NiMH) batteries, lead acid batteries, or lithium polymer batteries.

Hybrid vehicle 100 includes an energy management controller (EMC) 104, which obtains, derives, monitors, and/or processes a set of parameters associated with battery pack 102. These parameters may include, without limitation: current; voltage; SOC; state of health (SOH); battery internal resistances; battery internal reactances; and power output of the battery pack 102. Some of these parameters are discussed below with reference to FIG. 2.

A motor generator (MoGen) 106 is dynamically coupled to an internal combustion engine (ICE) 108 and functions as either a motor to propel the hybrid vehicle 100 or a generator to charge the battery pack 102, depending on the operating state of the hybrid vehicle 100 (i.e., braking, accelerating, or operating at a constant speed on a highway). The MoGen 106 is preferably an AC induction machine, but may comprise any known electrical motor/generator technology including but not limited to DC machines, synchronous machines, and switched reluctance machines. The MoGen 106 in this embodiment is located near the rear of the hybrid vehicle 100 to drive the rear wheels 110. A similar MoGen 112 is located near the front of the hybrid vehicle 100 to drive the front wheels 114.

The MoGens 106/112 are controlled by an electrical control system comprising a hybrid system controller 116, DC-DC converters 118, and power inverter modules (PIMs) 120. For this embodiment, EMC 104 is suitably configured to regulate the operation of PIMs 120. The EMC 104 communicates with the hybrid system controller 116 and PIMs 120 to provide voltage, current, and/or power output/input limits for the battery pack 102 based on an SOC measurement. In an alternate embodiment, the EMC 104, hybrid system controller 116, DC-DC converters 118, and PIMs 120 may be configured as a unitary system.

The EMC 104 and hybrid system controller 116 may comprise any type of control module or vehicle controller known in the art, and can be equipped with nonvolatile memory, random access memory (RAM), discrete and analog input/output (I/O), a central processing unit, and/or communications interfaces for networking within an automotive communications network. In this regard, the EMC 104, the hybrid system controller 116, and possibly other illustrative blocks, modules, processing logic, and circuits described in connection with the embodiments disclosed herein may be implemented or performed with a general purpose processor, a content addressable memory, a digital signal processor, an application specific integrated circuit, a field programmable gate array, any suitable programmable logic device, discrete gate or transistor logic, discrete hardware components, or any combination thereof, designed to perform the functions described herein. A processor may be realized as a microprocessor, a controller, a microcontroller, or a state machine. A processor may also be implemented as a combination of computing devices, e.g., a combination of a digital signal processor and a microprocessor, a plurality of microprocessors, one or more microprocessors in conjunction with a digital signal processor core, or any other such configuration.

Moreover, the steps of a method or algorithm described in connection with the embodiments disclosed herein may be embodied directly in hardware, in firmware, in a software module executed by a processor, or in any practical combination thereof. A software module may reside in RAM memory, flash memory, ROM memory, EPROM memory, EEPROM memory, registers, a hard disk, a removable disk, a CD-ROM, or any other form of storage medium known in the art. In this regard, an exemplary storage medium can be coupled to a processor such that the processor can read information from, and write information to, the storage medium. In the alternative, the storage medium may be integral to the processor. As an example, the processor and the storage medium may reside in an ASIC.

The subject matter and certain aspects of the embodiments thereof may be described in the general context of computer-executable instructions, such as program modules, executed by one or more computing modules, controllers, or other devices. Generally, program modules include routines, programs, objects, components, data structures, and/or other elements that perform particular tasks or implement particular abstract data types. Typically, the functionality of the program modules may be combined or distributed as desired in various embodiments. A computing device that performs computer-executable instructions typically includes at least some form of computer readable media. Computer readable media can be any available media that can be accessed by a computing device and/or by applications executed by a computing device.

Referring again to FIG. 1, in the generator mode, the MoGens 106/112 generate electrical energy that is transferred to the battery pack 102 and the DC-DC converters 118 by the hybrid system controller 116 and PIMs 120. The hybrid system controller 116 and PIMs 120 determine the direction of current flow for the MoGens 106/112, according to the particular operating state of hybrid vehicle 100. The DC-DC converters 118 provide and regulate a DC bus that is pulse-width-modulated by the PIMs 120 to supply time varying current to the MoGens 106/112. In a regenerative state (such as during braking) or charging condition, current will flow from the MoGens 106/112, via the PIMs 120, to charge the battery pack 102 and provide current to the DC-DC converters 118. In a state where the MoGens 106/112 are needed to provide propulsion, current will flow from the battery pack 102 to the MoGens 106/112, via the DC-DC converters 118 and PIMs 120, to power the MoGens 106/112.

For the embodiments described here, the SOC of the battery pack 102 (and/or the SOC of the cells in the battery pack 102) is dynamically tracked to determine when to charge the battery pack 102. The EMC 104 and hybrid system controller 116 are suitably configured to control the SOC between 20% to 80% so that the charge acceptance and efficiency during regenerative braking can be realized. However, controlling the battery pack 102 to any SOC percentage is within the scope of the embodiments described herein.

Figure 2:
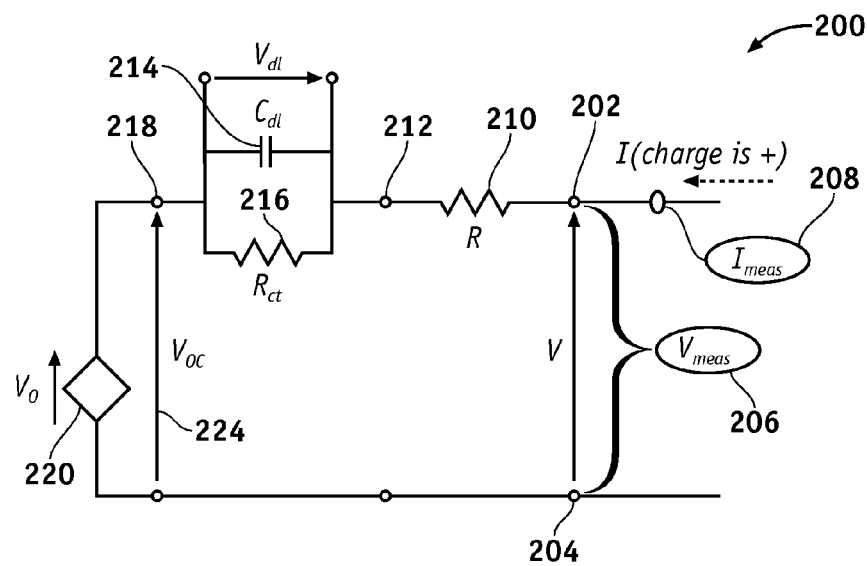
FIG. 2 is a diagram of an equivalent circuit used to model a battery system.

FIG. 2 is a diagram of an equivalent circuit 200 used to model a battery system, such as a lithium ion battery. Equivalent circuit 200 has a first node 202 and a second node 204, with a voltage (V) existing between the nodes. A voltage measuring means 206, such as a voltmeter, can be disposed between the first node 202 and the second node 204 to obtain a reading of the measured voltage V. An electric current measuring device 208 is adapted to measure an electric current at first node 202. For this embodiment, current flowing into the first node 202 represents a positive charging current for equivalent circuit 200. The dashed arrow in FIG. 2 represents this positive charging current.

Equivalent circuit 200 also includes a series resistance 210 disposed between a third node 212 and first node 202. Series resistance 210 is labeled R in FIG. 2. A capacitance 214 and a parallel resistance 216 are disposed between third node 212 and a fourth node 218. Capacitance 214 represents the internal double layer capacitance of the battery model. Accordingly, capacitance 214 is labeled $C_{dl}$ in FIG. 2. Resistance 216 represents the charge transfer resistance of the battery model—accordingly, resistance 216 is labeled $R_{ct}$ in FIG. 2. The voltage across capacitance 214 and resistance 216 is referred to as the double layer voltage, $V_{dl}$. Notably, $V_{dl}$ is an internal voltage that cannot be measured in a practical battery.

Equivalent circuit 200 also includes a battery voltage source 220 (labeled $V_o$) disposed between the fourth node 218 and the second node 204. An open circuit voltage 224 (labeled $V_{oc}$) is defined between fourth node 218 and second node 204. Referring to FIG. 1, in hybrid vehicle 100, $V_{oc}$ would represent the open terminal voltage of battery pack 102, which cannot be measured under normal operating conditions because battery pack 102 is connected to the electrical systems of hybrid vehicle 100. Notably, the measurable voltage V in FIG. 2 can be represented by the relationship $V=V_{oc}+V_{dl}+IR$.

As described in more detail below, EMC 104 (see FIG. 1) is suitably configured to determine the SOC and other battery parameters for a lithium ion battery pack 102 of hybrid vehicle 100, based upon measurable battery parameters, namely, the measured voltage V, the measured current I, and the measured battery temperature.

For this embodiment, a battery model (suitable for use with a lithium ion battery) is derived in the form of a difference equation that directly relates the battery internal parameters to the battery terminal voltage and current. An adaptive algorithm based on this battery model is then utilized to extract battery internal parameters from measured values of the battery terminal voltage and current. The methodology described herein adaptively estimates more battery variables in real time with less reliance on predetermined lookup tables for better adaptation to the environment and driving conditions, and to achieve high computational efficiency as well as low implementation cost.

Model Formulation

Referring to FIG. 2, lithium ion batteries can be characterized by the relationship $$V = V_{oc} + IR + V_{dl} \quad (1)$$

where V is the measured battery terminal voltage, I is the measured battery terminal current, $V_{oc}$ is the open-circuit voltage, R is the ohmic resistance, and $V_{dl}$ is the double layer voltage. The double layer voltage $V_{dl}$ can be further modeled as a first order dynamic process given by $$V_{dl} = AdtI_{-1} + \left(1 - \frac{dt}{\tau}\right)V_{dl-1} \quad (2)$$

where $$A = \frac{1}{C_{dl}}$$

is a constant, which is inversely proportional to the equivalent double layer capacitance $C_{dl}$, dt is the sampling time interval, $\tau$ is the time constant of the double layer process, and I−1 and Vdl−1 indicate the battery current and the double layer voltage of the previous time instant, respectively. Based on Equations (1) and (2), the battery model can be written into the following discrete form:

$$V(k) = V_{oc}U(k) + RI(k) + V_{dl}(k). \quad (3)$$

$$V_{dl}(k) = V_{dl}(k-1) - Bdt(k)V_{dl}(k-1) + Adt(k)I(k-1) \quad (4)$$

where k is the time step, U(k) is the unit step function (i.e., U(k)=1 for k≧0, and U(k)=0 for k<0), and $$B = \frac{1}{\tau}$$

is a constant that is inversely proportional to the time constant $\tau$.

In the battery model described by Equations (3) and (4), four internal battery parameters are to be estimated from the measured battery terminal voltage V(k) and current I(k) for control purposes. These four internal battery parameters are: the open circuit voltage $V_{oc}$ (used to infer battery SOC); the ohmic resistance R (used for power prediction); and the constants A and B (also used for power prediction). Note that once the parameters A and B are determined, the double layer voltage $V_{dl}$ can be obtained immediately from Equation (5) below. In other words, all the battery variables in the model are estimated adaptively in real time without relying on any lookup tables.

Next, a difference equation is derived from Equations (3) and (4) to model the lithium ion battery. This is achieved by substituting the expression for $V_{dl}(k)$ from Equation (4) into Equation (3) to obtain $$V(k) = V_{oc}U(k) + RI(k) + [V_{dl}(k-1) - Bdt(k)V_{dl}(k-1) + Adt(k)I(k-1)]. \quad (5)$$

From Equation (3), $V(k-1) = V_{oc}U(k-1) + RI(k-1) + V_{dl}(k-1)$, from which it follows that $$V_{dl}(k-1) = V(k-1) - V_{oc}U(k-1) - RI(k-1). \quad (6)$$

Substituting Vdl(k−1) in Equation (5) with that set forth in equation (6) and expanding the right side of Equation (5) results in $$V(k) = V_{oc}U(k) + RI(k) + V(k-1) - V_{oc}U(k-1) - RI(k-1) - Bdt(k)V(k-1) + BV_{oc}dt(k)U(k-1) + Bdt(k)RI(k-1) + Adt(k)I(k-1). \quad (7)$$

Reorganizing (7), and noticing that U(k)=U(k−1) for k>0, results in $$V(k)-V(k-1)=-Bdt(k)V(k-1)+R[I(k)-I(k-1)]+(BR+A)dt(k)I(k-1)+BV_{oc}dt(k)U(k-1). \quad (8)$$

The difference Equation (8) contains only the measured or known values such as V(k), V(k−1), I(k), I(k−1), dt(k) and U(k−1), and the battery parameters to be estimated. Therefore, the difference Equation (8) explicitly relates the battery internal parameters to the battery terminal voltage and current. Based on this model, an adaptive algorithm can be developed to extract the battery internal parameters from the terminal voltage and current.

Battery Parameter Extraction

In this section, an adaptive four parameter extraction algorithm is developed for the battery model represented by the difference Equation (8). For convenience, the following variables (battery parameters) are defined: $\theta_1=-B$, $\theta_2=R$, $\theta_3=BR+A$, and $\theta_4=BV_{oc}$. Then, the difference Equation (8) is rewritten as $$V(k)-V(k-1)=\theta_1 dt(k)V(k-1)+\theta_2[I(k)-I(k-1)]+\theta_3 dt(k)I(k-1)+\theta_4 dt(k)U(k-1). \quad (9)$$

To simplify the description, define $\theta=[\theta_1,\theta_2,\theta_3,\theta_4]^T$ as a vector of unknown parameters, define $\phi(k)=[dt(k)V(k-1), I(k)-I(k-1), dt(k)I(k-1), dt(k)U(k-1)]^T$ as a vector of known signals, and further represent Equation (9) by $$V(k)-V(k-1)=\theta^T\phi(k). \quad (10)$$

The superscript letter T in the above expressions indicates a matrix transpose. In practice, the parameters in the vector θ are estimated based on the known values of V(k), V(k−1), and Φ(k), and then the relevant battery parameters are calculated from the estimated θ parameters according to the following equations:

$$B=-\theta_1 \quad (11)$$

$$R=\theta_2 \quad (12)$$

$$A=\theta_3+\theta_1\theta_2 \quad (13)$$

$$V_{oc}=-\frac{\theta_4}{\theta_1} \quad (14)$$

The difference equation approach described herein facilitates the ability to regress the battery model calibrations dynamically via synthesis of terminal voltage components that are independent of one another (and, therefore, linearly separable from one another with respect to the regression).

Figure 3:
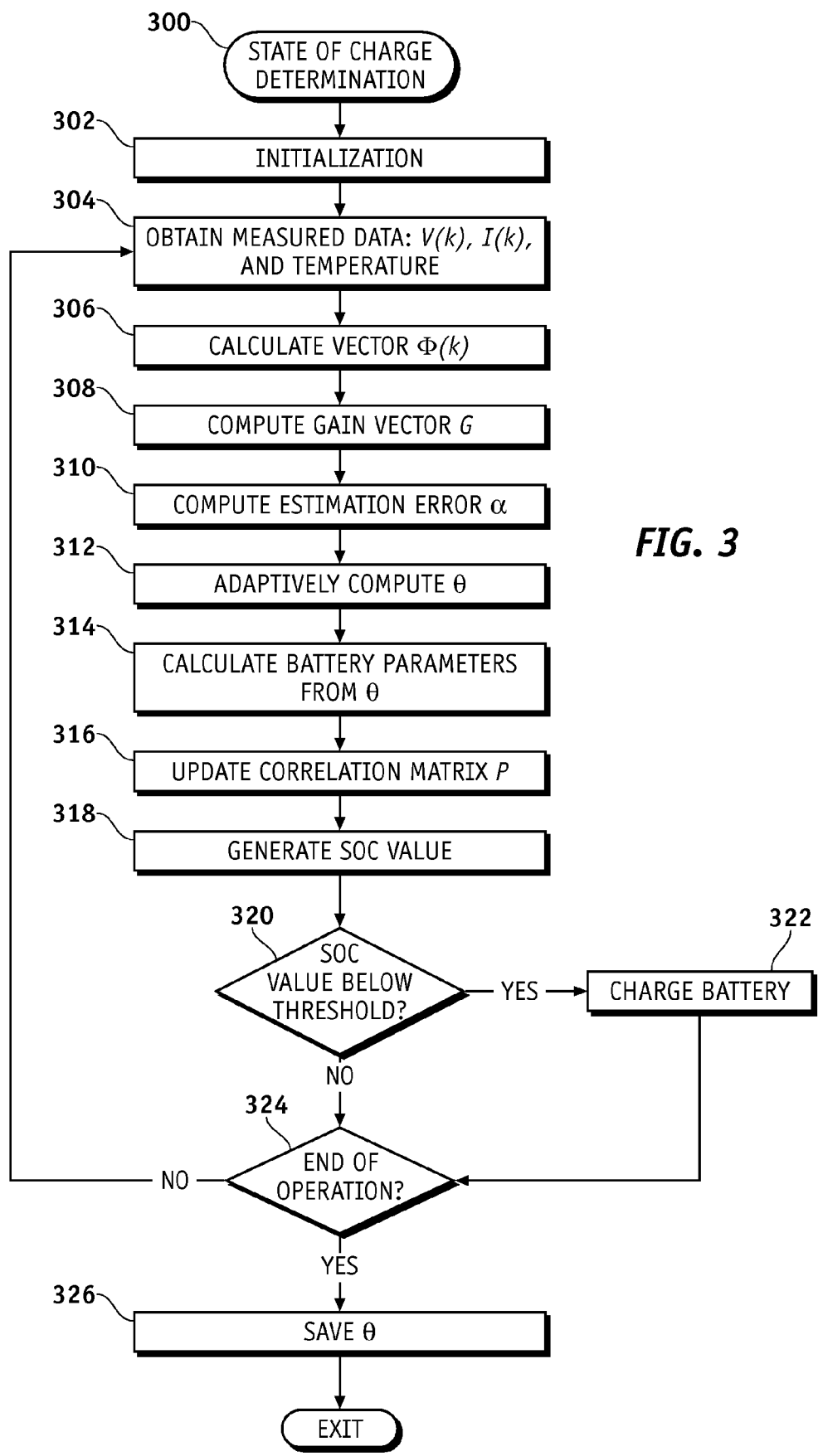
FIG. 3 is a flow chart that illustrates an embodiment of a battery SOC determination process.

FIG. 3 is a flow chart that illustrates an embodiment of a battery SOC determination process 300 that implements the techniques described above. The various tasks performed in connection with process 300 may be performed by software, hardware, firmware, or any combination thereof. For illustrative purposes, the following description of process 300 may refer to elements mentioned above in connection with FIG. 1 and FIG. 2. In practice, portions of process 300 may be performed by different elements of a diagnostic and control system for a vehicle battery, e.g., EMC 104 (FIG. 1), voltage measuring means 206 (FIG. 2), or electric current measuring device 208. It should be appreciated that process 300 may include any number of additional or alternative tasks, the tasks shown in FIG. 3 need not be performed in the illustrated order, and process 300 may be incorporated into a more comprehensive procedure or process having additional functionality not described in detail herein.

In a practical deployment, process 300 is initiated whenever the host vehicle is turned on. In this regard, process 300 begins with an initialization procedure (task 302). During this initialization, an arbitrary initial terminal voltage value and an arbitrary initial terminal current value are provided. These initial values are arbitrary in the sense that they need not be accurate estimates of the corresponding to-be-measured values. Indeed, any practical value can be provided for the initial terminal voltage and any practical value can be provided for the initial terminal current. This very relaxed criteria is in stark contrast to existing techniques that require accurate initial conditions for proper recursive settling.

During task 302, the initial terminal voltage value, V(0), and the initial terminal current value I(0) are utilized to set an initial condition for the generation of the next SOC value. For this embodiment, initial conditions for θ and P (described above) are set by reading from memory the estimation result of the last operation of process 300 from ROM. Task 302 also sets the initial correlation matrix P as a 4×4 positive definite matrix. This correlation or covariance matrix P indicates the extent to which random variables may co-vary. In this embodiment, four independent variables are listed in the vector Φ(k).

After initialization, process 300 obtains measured data for the terminal voltage (task 304). For this embodiment, the measured data includes sampled terminal voltage data, V(k), sampled terminal current data, I(k), and sampled battery temperature data that is read into memory, where k represents the current time sample. In one practical embodiment, the measured data is sampled once every 100 milliseconds. Of course, an embodiment of process 300 can use other sampling times and/or staggered sampling times for the different measured quantities.

Next, the vector quantity $\bar{\phi}(k)$ is calculated (task 306) from the present data, V(k) and I(k), the data from the previous reading, V(k−1) and I(k−1), the sampling time interval dt(k), and the unit step function U(k−1)=1. In particular, this vector quantity is calculated in accordance with the following relationship, which was explained above with reference to Equation (9) and Equation (10):

$$\bar{\phi}(k)=[dt(k)V(k-1),I(k)-I(k-1)dt(k)I(k-1),dt(k)U(k-1)]^T$$

In addition, process 300 computes (task 308) a gain vector G, which is a 4×1 vector including four gains for the four unknown parameters in θ. For this embodiment, the gain vector G is calculated in accordance with the following relationship:

$$G=\frac{P\bar{\phi}(k)}{\lambda+\bar{\phi}^T(k)P\bar{\phi}(k)}.$$

Here, P is the correlation matrix for the battery parameters $\theta_1$, $\theta_2$, $\theta_3$, and $\theta_4$, and λ is a forgetting factor, where $0\leq\lambda\leq1$. The gain vector represents a gain applied to the estimation error to indicate how much change will be made in the estimated parameters for the next time instant. The forgetting factor can be considered to be a changing weighting factor that is higher for more recent data and lower for more remote data; the forgetting factor eventually diminishes for very old data.

In task 310, process 300 computes an estimation error (α) in accordance with the relationship $\alpha=V(k)-V(k-1)-\theta^T\bar{\phi}(k)$. The estimation error is the error between the measured value and the value derived from the estimated result. A larger error means that the estimated parameters deviate from their real values such that a greater change will be made in the estimated parameters for the next time instant. Along with the gain vector, the estimation error indicates how much change will be made for the next time instant. Therefore, the goal of matching the measured value and estimated value is achieved by minimizing the estimation error. In task 312, process 300 adaptively computes θ, striving to minimize the estimation error in subsequent iterations. In this regard, task 312 computes θ in accordance with the relationship $\theta_{new} = \theta_{old} + G\alpha$.

Process 300 proceeds to calculate relevant battery parameters from the newest θ (task 314). For this embodiment, task 314 calculates the present $V_{oc}$ value, the present R value, the present A value, and the present B value from the current values of $\theta_1, \theta_2, \theta_3,$ and $\theta_4$. These four battery parameters are calculated using Equations (11), (12), (13), and (14) described above. As mentioned above, the present $V_{oc}$ value is dependent upon the $V_{dl}$ of the lithium ion battery, which cannot be directly measured. Nonetheless, the battery model and algorithm described herein enable process 300 to accurately estimate the present $V_{oc}$ value using relationships that contemplate $V_{dl}$.

Process 300 may also update the correlation matrix P for the next data point (task 316). For this embodiment, P is updated in accordance with the relationship $$P_{update} = \frac{1}{\lambda} P_{old} - \frac{1}{\lambda} G \vec{\phi}^T(k) P_{old}.$$

The updated correlation matrix can then be used for the next iteration.

Eventually, process 300 generates a present SOC value for the lithium ion battery (task 318). In practice, the present SOC value is a function of the present $V_{oc}$ value and the present value of the sampled temperature data. Referring to Equation (14), the present $V_{oc}$ value is calculated from the known present values of $\theta_1$ and $\theta_4$, namely, $$V_{oc} = -\frac{\theta_4}{\theta_1}.$$

The specific correlation between the present SOC value and the corresponding present values of $V_{oc}$ and temperature may vary from one battery type (i.e., nominal operating voltage, power rating, etc.) to another, and from one manufacturer to another. Known techniques can be used to correlate SOC to $V_{oc}$ and temperature. Such techniques are disclosed in U.S. Pat. No. 6,639,385 and in United States patent application publication number 2004/0162683A1. The relevant content of these patent documents is incorporated herein by reference. In a practical embodiment, process 300 accesses a lookup table populated with various $V_{oc}$ and temperature values, along with corresponding SOC values (i.e., percentages). In other words, the lookup table preferably includes an SOC percentage for all realistic and practical combinations of $V_{oc}$ and temperature.

As mentioned previously, the present SOC value can be used as an indicator of whether the lithium ion battery needs to be charged. In this regard, process 300 may compare the present SOC value to a threshold value, for example, 20% (query task 320). The threshold value may be selected according to the particular system environment, battery specifications, load conditions, or the like. Moreover, certain embodiments may be configured such that the threshold value is dynamically adjusted according to the particular operating conditions of the vehicle. If the present SOC value is less than the threshold value, then process 300 initiates charging of the lithium ion battery (task 322). For this embodiment, the vehicle systems are controlled in a suitable manner to accommodate such charging, as described above with reference to FIG. 1. It should be appreciated that the battery control methodology in an embodiment may be more complicated that a threshold setting, and, in particular, a battery control algorithm for a vehicle may be influenced by powertrain control. The techniques and technologies described herein provide an accurate SOC for use with battery control and power management.

If the present SOC value satisfies the threshold value, then process 300 may then proceed to determine whether it is the end of operation (query task 324). Query task 324 may also be performed during or after charging of the lithium ion battery. Here, the end of operation represents a state where the vehicle has been shut down for at least a minimum period of time, for example, one minute. If the end of operation has been detected, then process 300 saves the present θ in memory for use as an initial condition for the next operation (task 326). Thereafter, process 300 can exit. If the end of operation has not been detected, then process 300 preserves the present data points V(k) and I(k) for use as the data points V(k−1) and I(k−1) in the next update and returns to task 304 to continue updating θ and the correlation matrix P in the manner described above. Consequently, process 300 adaptively updates the present SOC value by repeating over time the loop of tasks shown in FIG. 3.

In certain embodiments, process 300 provides information other than the SOC to one or more vehicle subsystems. For example, process 300 could provide one or more of the battery internal parameters (R, τ, $C_{dl}$, or the double layer voltage $V_{dl}$) for use with other applications such as power prediction and battery state of health (SOH) monitoring.

Experimental Results

Experimental results of the adaptive four parameter extraction methodology described above show that the measured battery terminal voltage can be effectively and efficiently estimated using the battery model and extracted battery parameters. The methodology provides a very accurate terminal voltage estimation with a maximum estimation error of about 5.8 mV for a 4.0 volt battery cell. This is well below the resolution of practical vehicle voltage sensors. Notably, the methodology provides a good estimation of R under relatively high current conditions. This is important because the ohmic resistance R plays a dominant role when the magnitude of battery current is high. In addition, the methodology provides a good estimation of the parameters A and B under relatively low current conditions. This is important because the double layer effect plays a dominant role when the magnitude of current is low. In both of these situations, the reconstructed voltage based on the battery parameters extracted by the adaptive algorithm precisely matches the measured voltage. Furthermore, the technique described herein is relatively stable over a wide temperature range. Experimental results show that the estimation results remain accurate and stable at 40° C., 25° C., and −10° C.

Figure 4:
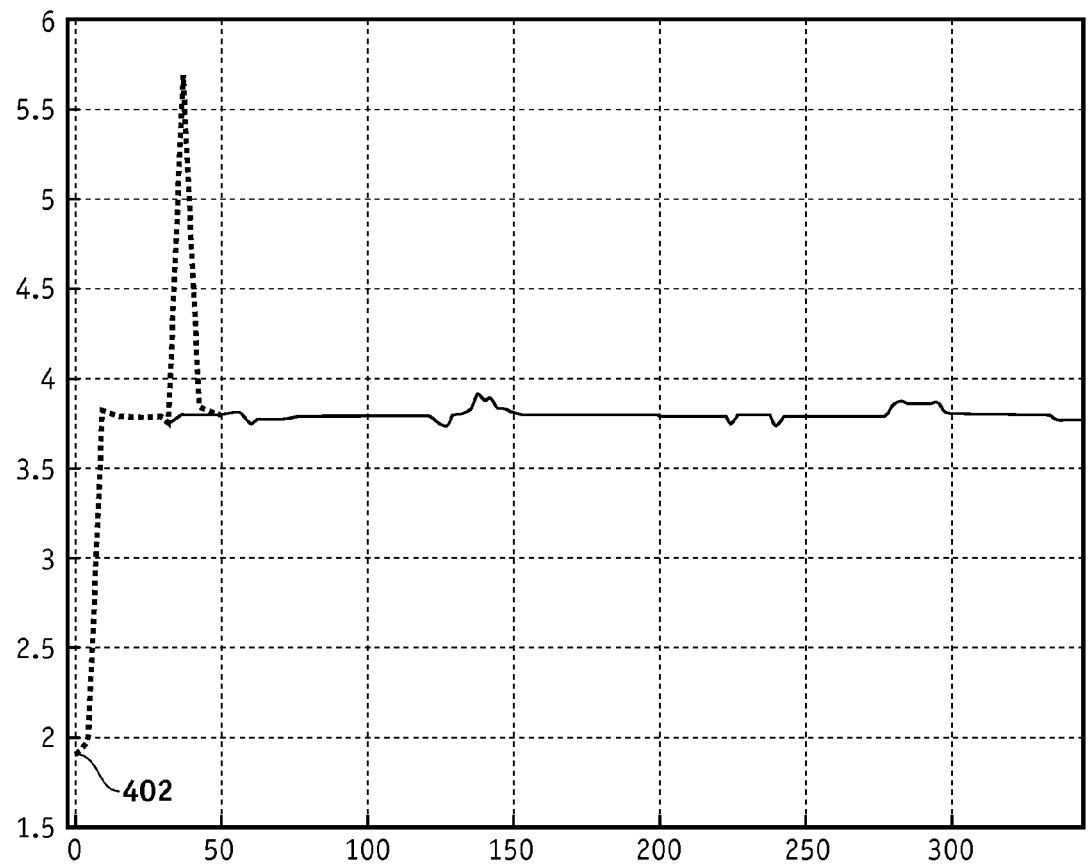
FIG. 4 is a graph that illustrates calculated battery voltage over time for an example where an incorrect initial voltage value is provided.

FIG. 4 is a graph that illustrates calculated battery voltage over time for an example where an incorrect initial voltage value is provided. The vertical scale indicates volts, the horizontal scale indicates time in seconds, and the experimental data was obtained at a temperature of 40° C. A significantly offset initial voltage 402 was intentionally entered as an initial condition. The two spikes depicted in dashed lines represent the adaptive adjustment and settling of the calculated battery voltage. Ultimately, the calculated battery voltage settles to an accurate estimation of the measured battery voltage. Thus, FIG. 4 shows the adaptation of the technique and its robustness to variations in initial conditions. Even with a completely incorrect initial condition (about 1.9 volts), the algorithm adapts and adjusts quickly (in approximately twenty seconds) to obtain the correct battery parameter estimates. As shown in FIG. 4, the actual measured voltage hovers around 3.8 volts, and the calculated voltage reaches the 3.8 volt range within twenty seconds.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. An automated method for determining state of charge (SOC) of a battery having an ohmic resistance (R), a double layer voltage ($V_{dl}$), an open circuit voltage ($V_{oc}$), and a characterizing constant $$\left(A = \frac{1}{C_{dl}}\right),$$

where $C_{dl}$ is a double layer capacitance of the battery, the method comprising:
- obtaining, at an electronic and processor-based energy management controller, sampled terminal voltage (V) data for the battery;
- obtaining, at the energy management controller, sampled terminal current (I) data for the battery;
- calculating, with the energy management controller, a vector quantity $\bar{\phi}(k)$ in accordance with the relationship $\bar{\phi}(k)=[dt(k)V(k-1), I(k)-I(k-1)dt(k)I(k-1)dt(k)U(k-1)]^T$, where k indicates a present time step, T indicates a matrix transpose, and U( ) indicates a unit step function;
- calculating, with the energy management controller, battery parameters $\theta_1, \theta_2, \theta_3$, and $\theta_4$ in accordance with the relationship $V(k)-V(k-1)=\theta^T \bar{\theta}(k)$, where $\theta=[\theta_1, \theta_2, \theta_3, \theta_4]^T$ and T indicates a matrix transpose;
- generating, with the energy management controller, a present SOC value from the battery parameters $\theta_1$ and $\theta_4$; and
- saving $\theta$ in a memory element, for use as an initial condition for a subsequent iteration of the method; wherein $$\theta_1 = -B = -\frac{1}{\tau},$$

where $\tau$ is a double layer time constant for the battery;
$\theta_2 = R$;
$\theta_3 = BR + A$; and
$\theta_4 = BV_{oc}$.

2. The method of claim 1, further comprising obtaining sampled battery temperature data for the battery, wherein generating a present SOC value comprises generating the present SOC value from the battery parameters $\theta_1$ and $\theta_4$ and from the sampled battery temperature data.

3. The method of claim 1, further comprising:
providing an arbitrary initial terminal voltage value;
providing an arbitrary initial terminal current value; and
setting an initial condition for generation of the present SOC value, the initial condition being based upon the arbitrary initial terminal voltage value and the arbitrary initial terminal current value.

4. The method of claim 1, further comprising:
comparing the present SOC value to a threshold value; and
if the present SOC value is less than the threshold value, initiating charging of the battery.

5. The method of claim 1, further comprising calculating a present $V_{oc}$, value for the battery in accordance with the relationship $$V_{oc} = -\frac{\theta_4}{\theta_1},$$

wherein generating a present SOC value comprises generating the present SOC value from the present $V_{oc}$ value.

6. The method of claim 1, wherein calculating battery parameters $\theta_1, \theta_2, \theta_3$, and $\theta_4$ comprises:
computing a gain vector (G) in accordance with the relationship $$G = \frac{P\bar{\phi}(k)}{\lambda + \bar{\phi}^T(k)P\bar{\phi}(k)},$$

where P is a correlation matrix for the battery parameters $\theta_1, \theta_2, \theta_3$, and $\theta_4$, $\lambda$ is a forgetting factor, and $0 < \lambda \leq 1$;
computing an estimation error ($\alpha$) in accordance with the relationship $\alpha = V(k) - V(k-1) \theta^T \bar{\phi}(k)$; and
adaptively computing $\theta$ in accordance with the relationship $\theta_{new} = \theta_{old} + G\alpha$.

7. The method of claim 6, further comprising updating P in accordance with the relationship $$P_{update} = \frac{1}{\lambda} P_{old} - \frac{1}{\lambda} G\bar{\phi}^T(k) P_{old}.$$

8. A diagnostic and control system for a vehicle battery, the diagnostic and control system comprising:
a lithium ion battery pack having an ohmic resistance (R), a double layer voltage ($V_{dl}$), an open circuit voltage ($V_{oc}$), and a characterizing constant $$\left(A = \frac{1}{C_{dl}}\right),$$

where $C_{dl}$ is a double layer capacitance of the lithium ion battery pack;
a power inverter module coupled to the lithium ion battery pack; and
a controller coupled to the power inverter module and to the lithium ion battery pack, the controller being configured to regulate operation of the power inverter module, and the controller comprising a computer-readable medium having stored thereon computer-executable instructions for determining state of charge (SOC) of the lithium ion battery pack, the computer-executable instructions being written to:

obtain sampled terminal voltage data (V) for the lithium ion battery pack;

obtain sampled terminal current (I) data for the lithium ion battery pack;

calculate a vector quantity $\bar{\phi}(k)$ in accordance with the relationship $\bar{\phi}(k)=[dt(k)V(k-1), I(k) -I(k-1)dt(k) I(k-1), dt(k)U(k-1)]^T$, where k indicates a present time step, T indicates a matrix transpose, and U( ) indicates a unit step function;

calculate battery parameters $\theta_1, \theta_2, \theta_3$, and $\theta_4$ in accordance with the relationship $V(k)-V(k-1)=\theta^T \bar{\phi}(k)$, where $\theta=[\theta_1, \theta_2, \theta_3, \theta_4]^T$ and T indicates a matrix transpose; and generate a present SOC value from the battery parameters $\theta_1$ and $\theta_4$; wherein $\theta_1=-B=-1/\tau$, where $\tau$ is a double layer time constant for the battery;

$\theta_2=R$;

$\theta_3=BR+A$; and $\theta_4=BV_{oc}$.

9. The diagnostic and control system of claim 8, the computer-executable instructions being written to:

obtain sampled battery temperature data for the lithium ion battery pack; and generate the present SOC value from a present $V_{oc}$ value and the sampled battery temperature data.

10. The diagnostic and control system of claim 8, the computer-executable instructions being written to adaptively update the present SOC value by repeating over time the steps of obtaining sampled terminal voltage data, obtaining sampled terminal current data, calculating a vector quantity, calculating battery parameters, and generating a present SOC value.

11. The diagnostic and control system of claim 8, the computer-executable instructions being written to:

provide an arbitrary initial terminal voltage value;

provide an arbitrary initial terminal current value; and set an initial condition for generation of the present SOC value, the initial condition being based upon the arbitrary initial terminal voltage value and the arbitrary initial terminal current value.

12. The diagnostic and control system of claim 8, the computer-executable instructions being written to:

compare the present SOC value to a threshold value; and if the present SOC value is less than the threshold value, initiate charging of the lithium ion battery pack.

* * * * *